United States Patent
Lee

(10) Patent No.: US 11,180,855 B2
(45) Date of Patent: Nov. 23, 2021

(54) SEMICONDUCTOR MANUFACTURING COMPONENT COMPRISING DEPOSITION LAYER COVERING INTERLAYER BOUNDARY AND MANUFACTURING METHOD THEREOF

(71) Applicant: TOKAI CARBON KOREA CO., LTD., Gyeonggi-do (KR)

(72) Inventor: Sang Chul Lee, Chungcheong-nam-do (KR)

(73) Assignee: TOKAI CARBON KOREA CO., LTD., Gyeonggi-do (KR)

( * ) Notice: Subject to any disclaimer, the term of this patent is extended or adjusted under 35 U.S.C. 154(b) by 0 days.

(21) Appl. No.: 16/466,158

(22) PCT Filed: Dec. 18, 2017

(86) PCT No.: PCT/KR2017/014904
§ 371 (c)(1),
(2) Date: Jun. 3, 2019

(87) PCT Pub. No.: WO2018/117556
PCT Pub. Date: Jun. 28, 2018

(65) Prior Publication Data
US 2020/0063269 A1    Feb. 27, 2020

(30) Foreign Application Priority Data

Dec. 20, 2016 (KR) .................... 10-2016-0174615

(51) Int. Cl.
*C23C 16/01* (2006.01)
*C23C 28/04* (2006.01)
(Continued)

(52) U.S. Cl.
CPC ............ *C23C 28/048* (2013.01); *C23C 16/01* (2013.01); *C23C 16/325* (2013.01); *H01L 21/67069* (2013.01)

(58) Field of Classification Search
CPC ..... C23C 16/01; C23C 16/325; C23C 28/048; H01L 21/02; H01L 21/3065;
(Continued)

(56) References Cited

U.S. PATENT DOCUMENTS 5,233,218 A    8/1993  Miura
6,670,705 B1  12/2003  Harris et al.
(Continued)

FOREIGN PATENT DOCUMENTS

CN    102130259 A    7/2011
JP    H04129267 A    4/1992
(Continued)

OTHER PUBLICATIONS

International Search Report for International Patent Application No. PCT/KR2017/014904, dated Mar. 29, 2018, 2 pages.

*Primary Examiner* — Lawrence D Ferguson
(74) *Attorney, Agent, or Firm* — Armstrong Teasdale LLP

(57) ABSTRACT

The present invention relates to a semiconductor manufacturing component for manufacturing a semiconductor device by using a substrate such as a wafer in a dry etching process, and a manufacturing method thereof. The semiconductor manufacturing component comprising a deposition layer covering an interlayer boundary according to the present invention comprises: a base material containing carbon; a first deposition layer formed on the base material; a second deposition layer formed on the first deposition layer; and a third deposition layer formed on the first deposition layer and the second deposition layer, and formed to cover at least one portion of a boundary line between the first deposition layer and the second deposition layer.

11 Claims, 5 Drawing Sheets

(51) Int. Cl.
*C23C 16/32* (2006.01)
*H01L 21/67* (2006.01)

(58) Field of Classification Search
CPC .......... H01L 21/3213; H01L 21/67069; H01L 21/68757; H05H 1/46
See application file for complete search history.

(56) References Cited

U.S. PATENT DOCUMENTS

| | | |
|---|---|---|
| 6,902,763 B1 | 6/2005 | Elers et al. |
| 9,136,113 B2 * | 9/2015 | Landru .............. H01L 21/02532 |
| 9,859,329 B2 * | 1/2018 | Hirota ............... H01L 27/14689 |
| 2004/0168640 A1 | 9/2004 | Muto et al. |
| 2009/0183771 A1 * | 7/2009 | Sannomiya ........... H01L 31/204 |
| | | 136/258 |
| 2014/0030486 A1 | 1/2014 | Sun et al. |

FOREIGN PATENT DOCUMENTS

| | | |
|---|---|---|
| JP | H07328831 A | 12/1995 |
| JP | H11199323 A | 7/1999 |
| JP | 2001257163 A | 9/2001 |
| JP | 2015530737 A | 10/2015 |
| KR | 20020044140 A | 6/2002 |
| TW | 200741857 A | 11/2007 |
| TW | 201447022 A | 12/2014 |
| TW | 201505092 A | 2/2015 |
| TW | 201519351 A | 5/2015 |

* cited by examiner

SEMICONDUCTOR MANUFACTURING COMPONENT COMPRISING DEPOSITION LAYER COVERING INTERLAYER BOUNDARY AND MANUFACTURING METHOD THEREOF

TECHNICAL FIELD

Example embodiments relate to a semiconductor manufacturing component used to manufacture a semiconductor device using a substrate such as a wafer in a dry etching process and a method of manufacturing the same, and more particularly, to a semiconductor manufacturing component including a plurality of layers including a deposition layer covering an interlayer boundary and a method of manufacturing the same.

BACKGROUND ART

In general, a plasma processing method used in a semiconductor manufacturing process is one of dry etching processes through which a target is etched using gas. This method may include injecting etching gas into a reaction vessel and ionizing it, accelerating it to a wafer surface, and physically and chemically removing the wafer surface. The method is widely used because it is easy to control etching and is highly productive, and enables a formation of a fine pattern of tens of nanometers (nm).

When performing plasma etching, parameters to be considered for uniform etching may include a thickness and a density of a layer to be etched, an amount of energy and a temperature of etching gas, an adhesion of a photoresist, a state of a wafer surface, uniformity of the etching gas, and the like. In addition, a radio frequency (RF), which is a driving force to perform etching by ionizing etching gas and accelerating the ionized etching gas to a wafer surface, may also be an important parameter that is directly or readily adjustable in an actual etching process.

Considering a wafer on which etching is performed in an actual dry etching device, it is necessary to apply even or smooth RFs to enable a uniform energy distribution on an entire surface of the wafer. However, the uniform energy distribution in such a case of the application of such RFs may not be achieved only by controlling an output of the RFs. This may greatly depend on semiconductor manufacturing components including, for example, a focus ring of a type of stage and anode which is used as an RF electrode to apply an RF to the wafer.

Various semiconductor manufacturing components including a focus ring in a dry etching device may be used to allow plasma to be concentrated around a wafer on which an etching process is performed in a reaction vessel under an unfavorable condition in the presence of plasma. Herein, such a component itself may be exposed to plasma and thus damaged. Thus, research has been continuously conducted to increase plasma resistance of a semiconductor manufacturing component.

To improve plasma resistance of a semiconductor manufacturing component, various methods including a chemical vapor deposition method may be performed. However, when forming a thick deposition layer at a time to deposit a plasma-resistant material in the semiconductor manufacturing component, various issues may occur therefrom.

For example, when a great amount of source gas is injected and a high-temperature deposition material is continuously stacked, an abnormal crystal structure grown from an abnormal structure, for example, a nucleus formed by impurities or through a homogeneous reaction, may be generated. Such abnormal crystal structure, which is initially generated in a small size, may continuously grow while such continuous deposition is being performed, and may thus affect all or some of semiconductor manufacturing components and result in deteriorating a material characteristic of a final product.

DISCLOSURE OF INVENTION

Technical Goals

Example embodiments provide a semiconductor manufacturing component including a deposition layer covering an interlayer boundary and a method of manufacturing the semiconductor manufacturing component to provide a solution to such an issue described above. It is possible to improve plasma resistance and efficiency of a production process, and prevent an abnormal expansion of an abnormal crystal structure by rapidly depositing a plurality of layers and depositing a plasma-resistant layer to cover a boundary between the plurality of layers.

However, the example embodiments are not limited to what is described above, and it is thus obvious to those skilled in the art that other tasks not described herein may also be achieved from the example embodiments to be described hereinafter.

Technical Solutions

According to an example embodiment, there is provided a semiconductor manufacturing component including a deposition layer covering an interlayer boundary, the semiconductor manufacturing component including a first deposition layer, a second deposition layer formed on the first deposition layer, and a third deposition layer formed on the second deposition layer to cover at least a portion of a boundary between the first deposition layer and the second deposition layer.

The first deposition layer, the second deposition layer, or both the first deposition layer and the second deposition layer may be formed of a plurality of layers, and the third deposition layer may be formed to cover at least a portion of a boundary between the plurality of layers of the first deposition layer, the second deposition layer, or both the first deposition layer and the second deposition layer.

A grain size of each of the first deposition layer and the second deposition layer may be greater than a grain size of the third deposition layer.

A ratio of a sum of respective diffraction peak intensities of a face 200 and a face 220 to a diffraction peak intensity of a face 111 of an X-ray diffraction spectrum of each of the first deposition layer and the second deposition layer may be 0.9 to 3.5.

A ratio of a sum of respective diffraction peak intensities of a face 200 and a face 220 to a diffraction peak intensity of a face 111 of an X-ray diffraction spectrum of the third deposition layer may be 0.05 to 0.9.

A ratio of a diffraction peak intensity of a face 311 to a diffraction peak intensity of the face 111 of the X-ray diffraction spectrum of the third deposition layer may be 0.05 to 0.3.

Each of the first deposition layer, the second deposition layer, and the third deposition layer may include at least one of silicon carbide (SiC) or tantalum carbide (TaC).

The first deposition layer, the second deposition layer, and the third deposition layer may have a same composition.

A thickness of the third deposition layer may be 0.7 millimeters (mm) to 2.5 mm.

The first deposition layer and the second deposition layer may have different transmittance values.

The plurality of layers of the first deposition layer, the second deposition layer, or both the first deposition layer and the second deposition layer may have different transmittance values.

The semiconductor manufacturing component may be a component of a plasma processing device including at least one selected from a group consisting of a ring, an electrode portion, and a conductor.

According to another example embodiment, there is provided a method of manufacturing a semiconductor manufacturing component including a deposition layer covering an interlayer boundary, the method including preparing a base material, forming a first deposition layer on the base material through chemical vapor deposition, forming a second deposition layer on the first deposition layer through the chemical vapor deposition, performing first processing, forming a third deposition layer, and performing second processing.

A flow rate and a composition of deposition gas in the forming of the first deposition layer may be the same as a flow rate and a composition of deposition gas in the forming of the second deposition layer.

A supply flow rate of deposition gas in the forming of the third deposition layer may be 30% to 80% of a supply flow rate of the deposition gas in the forming of the first deposition layer and the forming of the second deposition layer.

A deposition layer forming speed in the forming of the first deposition layer and the forming of the second deposition layer may be 30 micrometers per hour (μm/hr) to 65 μm/hr.

A deposition layer forming speed in the forming of the third deposition layer may be 30% to 80% of the deposition layer forming speed in the forming of the first deposition layer and the forming of the second deposition layer.

The method may further include cleaning between the performing of the first processing and the forming of the third deposition layer, after the performing of the second processing, or between the performing of the first processing and the forming of the third deposition layer and after the performing of the second processing.

The performing of the first processing may be to process a face including at least a portion of a boundary between the first deposition layer and the second deposition layer.

The performing of the first processing may include removing the base material.

The performing of the second processing may include removing the base material.

The base material may include at least one selected from a group consisting of graphite, carbon black, SiC, TaC, and zirconium carbide (ZrC).

Advantageous Effects

According to example embodiments described herein, a semiconductor manufacturing component including a deposition layer covering an interlayer boundary, and a method of manufacturing the semiconductor manufacturing component may prevent growth of an abnormal crystal of an abnormal structure by forming a plurality of layers. In addition, it is possible to improve a product durability by forming a plasma-resistant layer when forming the plurality of layers to cover an interlayer boundary that is susceptible to plasma and is thus easily etched. Further, it is possible to reduce a production time used to manufacture all semiconductor manufacturing components and improve efficiency of a product manufacturing process by controlling a flow rate and a deposition speed of each layer based on use of each layer.

BEST MODE FOR CARRYING OUT THE INVENTION

Figure 1:
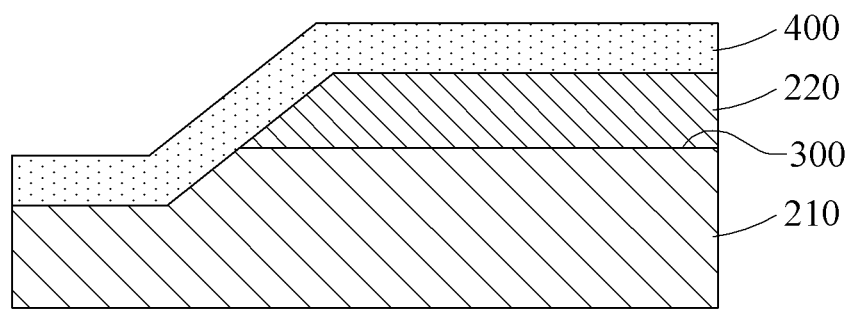
FIG. 1 illustrates a cross section of a semiconductor manufacturing component including a deposition layer covering an interlayer boundary that is manufactured according to an example embodiment.

Hereinafter, example embodiments will be described with reference to the accompanying drawings, wherein like reference numerals refer to the like elements throughout.

However, various changes, modifications, and equivalents of the methods, apparatuses, and/or systems described herein will be apparent after an understanding of the disclosure of this application. The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for the purpose of describing particular embodiments only and is not intended to be limiting the present disclosure. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, operations, elements, and/or components, but do not preclude the presence or addition of one or more other features, integers, operations, elements, components, and/or groups thereof.

Unless otherwise defined, all terms, including technical and scientific terms, used herein have the same meaning as commonly understood by one of ordinary skill in the art to which this disclosure pertains based on an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Reference will now be made in detail to the example embodiments. Regarding the reference numerals assigned to the elements in the drawings, it should be noted that the same elements will be designated by the same reference numerals, wherever possible, even though they are shown in different drawings. Also, in the description of the example embodiments, detailed description of well-known related structures or functions will be omitted when it is deemed that such description will cause ambiguous interpretation of the present disclosure.

FIG. 1 illustrates a cross section of a semiconductor manufacturing component including a deposition layer covering an interlayer boundary that is manufactured according to an example embodiment.

A semiconductor manufacturing component including a deposition layer covering an interlayer boundary includes a first deposition layer 210, a second deposition layer 220 formed on the first deposition layer 210, and a third deposition layer 400 formed to cover at least a portion of a boundary 300 between the first deposition layer 210 and the second deposition layer 220.

According to an example embodiment, a semiconductor manufacturing component may be manufactured by forming a first deposition layer, a second deposition layer, and a third deposition layer, on a base material including carbon, and then removing the base material therefrom.

Figure 2:
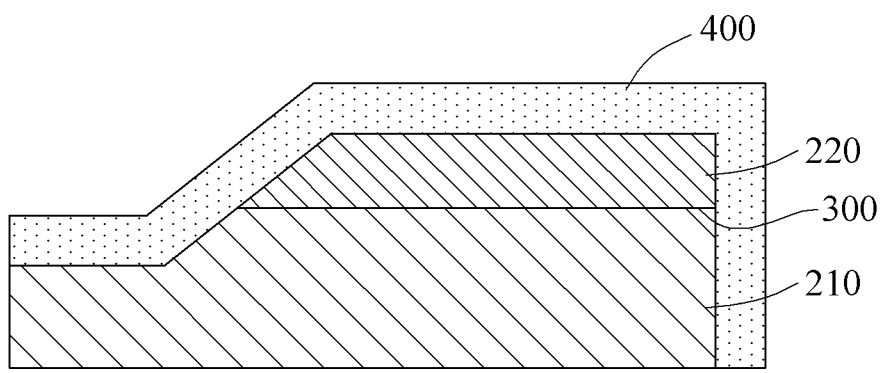
FIG. 2 illustrates a cross section of a semiconductor manufacturing component including a deposition layer covering an interlayer boundary that is manufactured according to another example embodiment.

FIG. 2 illustrates a cross section of a semiconductor manufacturing component including a deposition layer covering an interlayer boundary that is manufactured according to another example embodiment.

FIGS. 1 and 2 illustrate cross sections of examples of a semiconductor manufacturing component from which a base material is removed.

When a composition of deposition gas used to form a first deposition layer and a composition of deposition gas used to form a second deposition layer are different from each other, and when they are the same, a boundary or a boundary line may be generated between the formed layers. Herein, a third deposition layer may be formed to cover at least a portion of the generated boundary between the first deposition layer and the second deposition layer.

According to an example embodiment, a third deposition layer may be formed to cover at least a portion of a boundary between a first deposition layer and a second deposition layer in a plasma etching device such that the boundary is not exposed to plasma. The third deposition layer may be formed to cover an upper surface of the semiconductor manufacturing component as illustrated in FIG. 1, and formed to cover both the upper surface and one side surface of the semiconductor manufacturing component as illustrated in FIG. 2. In both examples, the third deposition layer may cover at least a portion of the boundary between the first deposition layer and the second deposition layer.

As described above, when high-temperature deposition gas is continuously deposited, an abnormal crystal structure may continue to grow. Thus, by forming the first deposition layer and the second deposition layer separately, it is possible to prevent such a continuous growth of the abnormal crystal structure.

However, when the layers are stacked separately as described above, the semiconductor manufacturing component, such as, for example, a focus ring used in the plasma etching process, may experience an issue that the boundary between the first deposition layer and the second deposition layer is greatly etched. This may result in deterioration of durability of the semiconductor manufacturing component, and thus a scattered material of the deposition layers may cause a flaw in a finally manufactured semiconductor product. Thus, the first deposition layer and the second deposition layer that are formed to improve plasma resistance of the component may not be effective.

According to an example embodiment, to prevent such an issue that may arise when layers are formed through a stacking process, there is provided a semiconductor manufacturing component including a third deposition layer to cover at least a portion of a boundary between a first deposition layer and a second deposition layer.

The first deposition layer, the second deposition layer, or both the first deposition layer and the second deposition layer may include a plurality of layers, and the third deposition layer may be formed to cover at least a portion of a boundary between the plurality of layers of the first deposition layer, the second deposition layer, or both the first deposition layer and the second deposition layer. That is, each of the first deposition layer and the second deposition layer may be formed of the plurality of layers.

A grain size of each of the first deposition layer and the second deposition layer may be greater than a grain size of the third deposition layer.

When forming a deposition layer at a relatively high speed, productivity may increase. However, by forming the deposition layer that fast, a grain size of the deposition layer may become larger, and thus a sparse structure may be formed accordingly and plasma resistance may thus be degraded. In contrast, when forming a deposition layer at a relatively low speed, productivity may decrease. However, by forming the deposition layer that slow, a grain size of the deposition layer may become smaller, and thus a dense structure may be formed accordingly and plasma resistance may thus be improved.

Thus, as described herein, the third deposition layer may be formed to have a smaller grain size, and may thus have an improved plasma resistance. In addition, the first deposition layer and the second deposition layer may be formed to have a relatively larger grain size and deposited within a relatively short period of time, in order to improve productivity of an overall process. Herein, even if the third deposition layer is formed at a relatively lower speed than the first deposition layer and the second deposition layer, an amount of time used to deposit the first deposition layer and the second deposition layer may be reduced greatly, and thus an overall production speed may be improved.

A deposition layer of the semiconductor manufacturing component may include an anisotropic crystal of which highly crystalline and various crystal faces are grown. Such crystal faces are illustrated in FIGS. 3a and 3b.

Figure 3A:
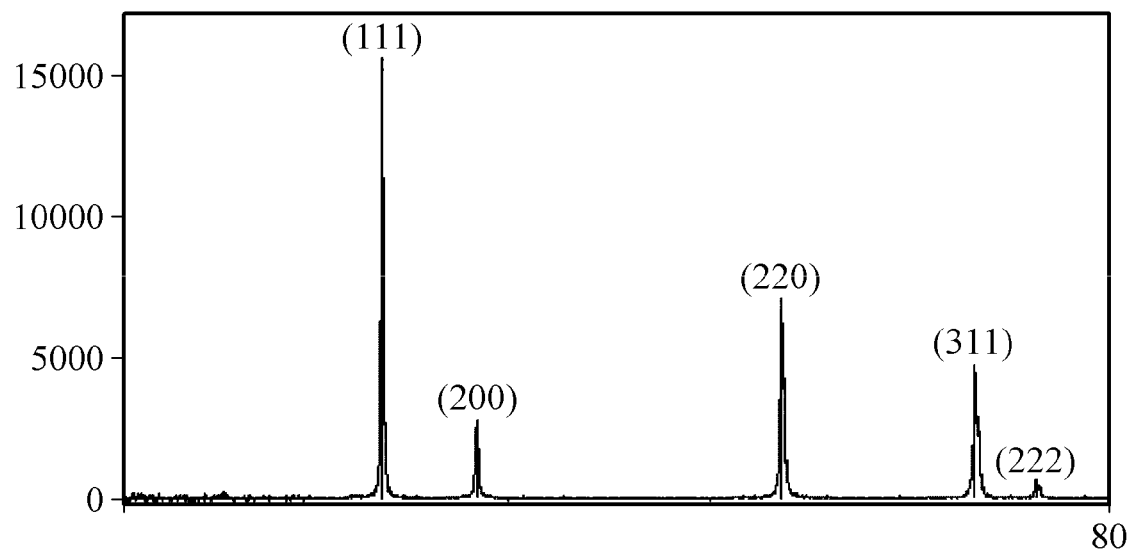
FIGS. 3a and 3b illustrate an X-ray diffraction pattern of a semiconductor manufacturing component including a deposition layer covering an interlayer boundary that is manufactured according to an example embodiment.
Figure 3B:
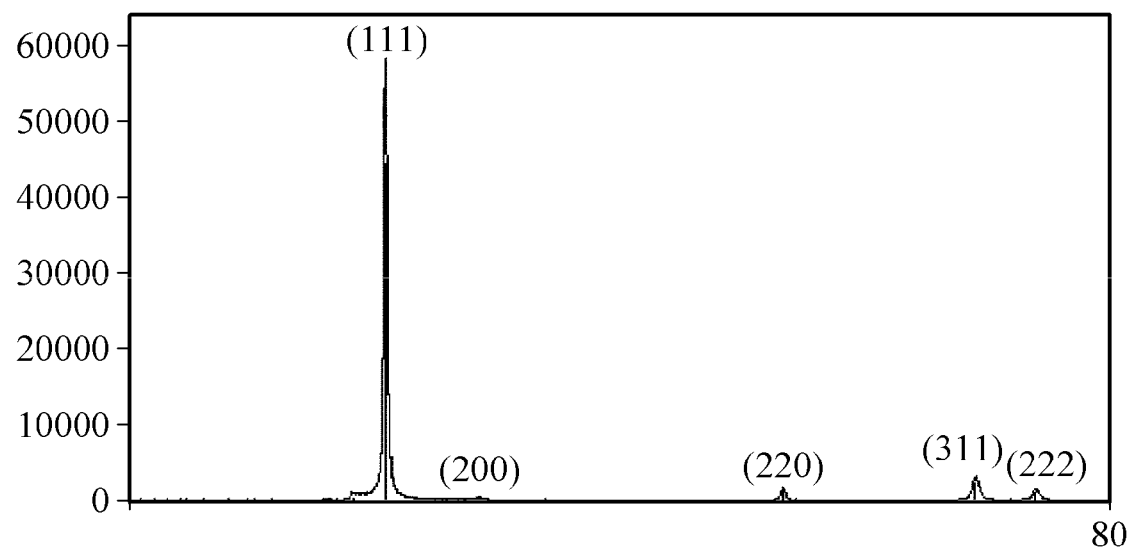

FIGS. 3a and 3b illustrate an X-ray diffraction (XRD) pattern of a semiconductor manufacturing component including a deposition layer covering an interlayer boundary that is manufactured according to an example embodiment. FIG. 3a is a graph illustrating an XRD pattern of a first deposition layer and a second deposition layer that are formed according to an example embodiment, and FIG. 3b is a graph illustrating an XRD pattern of a third deposition layer formed according to an example embodiment.

The XRD patterns illustrated in FIGS. 3a and 3b may be obtained using an XRD measurement method applied in related technical fields, for example, an X-ray thin-film diffraction measurement technique and an X-ray powder diffraction measurement technique. The graphs illustrated in FIGS. 3a and 3b may be obtained by manufacturing the semiconductor manufacturing component using silicon carbide (SiC) for forming the first through third deposition layers and irradiating an X-ray to each layer. Herein, an X-ray analyzer obtained an X-ray pattern in which a vertical axis indicates a diffraction intensity and a horizontal axis indicates a diffraction angle (2θ) using DMAX 2500 (Rigaku), and verified a SiC component by MDI/JADE 35-0801.

A ratio of a diffraction peak intensity in each crystal face direction indicates a crystal growth in each direction, and each deposition layer may have a unique crystal face diffraction peak intensity value determined based on a deposition environment thereof. Referring to the X-ray patterns, it is possible to obtain an index indicating a physical property of each deposition layer based on how far a crystal growth progresses in other crystal face directions, for example, directions of a face 200, a face 220, and a face 311, compared to a face 111.

It is verified that a ratio of a sum of diffraction peak intensities of the face 200 and the face 220 to a diffraction peak intensity of the face 111 of an XRD spectrum of each of the first deposition layer and the second deposition layer is 0.9 to 3.5.

It is verified that a ratio of a sum of diffraction peak intensities of the face 200 and the face 220 to a diffraction peak intensity of the face 111 of an XRD spectrum of the third deposition layer is 0.05 to 0.9.

It is verified that a ratio of a diffraction peak intensity of the face 311 to the diffraction peak intensity of the face 111 of the XRD spectrum of the third deposition layer is 0.05 to 0.3.

This indicates that, in each of the first deposition layer and the second deposition layer, a sum of intensities of growth faces in the directions of the face 200 and the face 220 is considerably higher compared to a growth face in the direction of the face 111, which indicates a considerably higher growth. In contrast, this indicates that, in the third deposition layer, a sum of intensities of growth faces in the directions of the face 200 and the face 220 is not that high compared to a growth face in the direction of the face 111. This also indicates that, in the third deposition layer, an intensity of a growth face of the face 311 is not that high compared to the growth face in the direction of the face 111.

According to an example embodiment, each of the first deposition layer, the second deposition layer, and the third deposition layer may include at least one of SiC or tantalum carbide (TaC). In addition, compositions of the first deposition layer, the second deposition layer, and the third deposition layer may be the same.

The first deposition layer, the second deposition layer, and the third deposition layer may be different from one another in terms of plasma-resistant characteristic, but they are formed with the same composition.

According to an example embodiment, a thickness of the third deposition layer may be 0.7 millimeters (mm) to 2.5 mm.

It is desirable to form the third deposition layer based on a thickness to be damaged by plasma in a dry etching device. For example, in a case of a plasma-resistant material to be etched by plasma in the dry etching device, approximately 0.5 mm may be etched in general based on a type of the material. However, according to an example embodiment, the third deposition layer may be formed to have a thickness of 0.7 mm to 2.5 mm such that a boundary between the first deposition layer and the second deposition layer is not to be exposed even if a portion of the third deposition layer is etched by plasma. When the thickness of the third deposition layer is less than 0.7 mm, the boundary between the first deposition layer and the second deposition layer may be exposed based on a selected material, and thus the component may be greatly damaged. Whereas, when the thickness of the third deposition layer is greater than 2.5 mm, productivity of a final product may deteriorate.

According to an example embodiment, the first deposition layer and the second deposition layer may have different transmittance values.

The term "transmittance" used herein indicates a degree of light passing through a material layer, which corresponds to a value obtained by dividing an intensity of light passing through the material layer by an intensity of incident light with respect to the material layer. The transmittance may be measured using various methods. For example, the transmittance may be measured by preparing a 3*mm*-thick specimen and measuring within a distance, 7 centimeters (cm), between the specimen and a light source with a light intensity of 150 lux or greater. The transmittance may vary based on a thickness of a specimen, a light source, or a distance between the specimen and the light source, and thus the transmittance may be considered a relative value in a case of the same thickness.

The transmittance may be a unique property of a material, and thus materials having the same component and composition may have different transmittance values based on a crystal structure or phase. The semiconductor manufacturing component including a deposition layer covering an interlayer boundary may include the first deposition layer and the second deposition layer that have different transmittance values. Each of the first deposition layer and the second deposition layer may include a plurality of layers.

Although the stacked first deposition layer and the stacked second deposition layer may be formed with deposition gas of a same composition, a color may gradually overlap and thus change on a boundary therebetween. The first deposition layer and the second deposition layer formed as described above may thus have the different transmittance values.

According to an example embodiment, growth of an abnormal crystal structure formed by an abnormal texture may be cut off on the boundary between the stacked first deposition layer and the stacked second deposition layer. Thus, it is possible to control such a continuous growth of the abnormal crystal structure by forming each layer stepwise by cutting off an existing continuous deposition process. Thus, the abnormal crystal structure may not grow continuously as the existing continuous deposition process is cut off, and thus a structure in which such an abnormal crystal growth is cut off on a boundary of each layer may be formed.

The first deposition layer, the second deposition layer, or the plurality of layers of both the first deposition layer and the second deposition layer may have different transmittance values.

According to an example embodiment, the semiconductor manufacturing component may be a component of a plasma processing device, which may include at least one selected from a group consisting of a ring, an electrode portion, and a conductor. The semiconductor manufacturing component including the first through third deposition layers may be used to solve an issue that a component of the plasma processing device is exposed to plasma and is therefore etched. Thus, the component of the plasma processing device may include a ring, an electrode portion, a conductor, and the like that may be generally exposed to plasma. The ring may include a focus ring.

Figure 4:
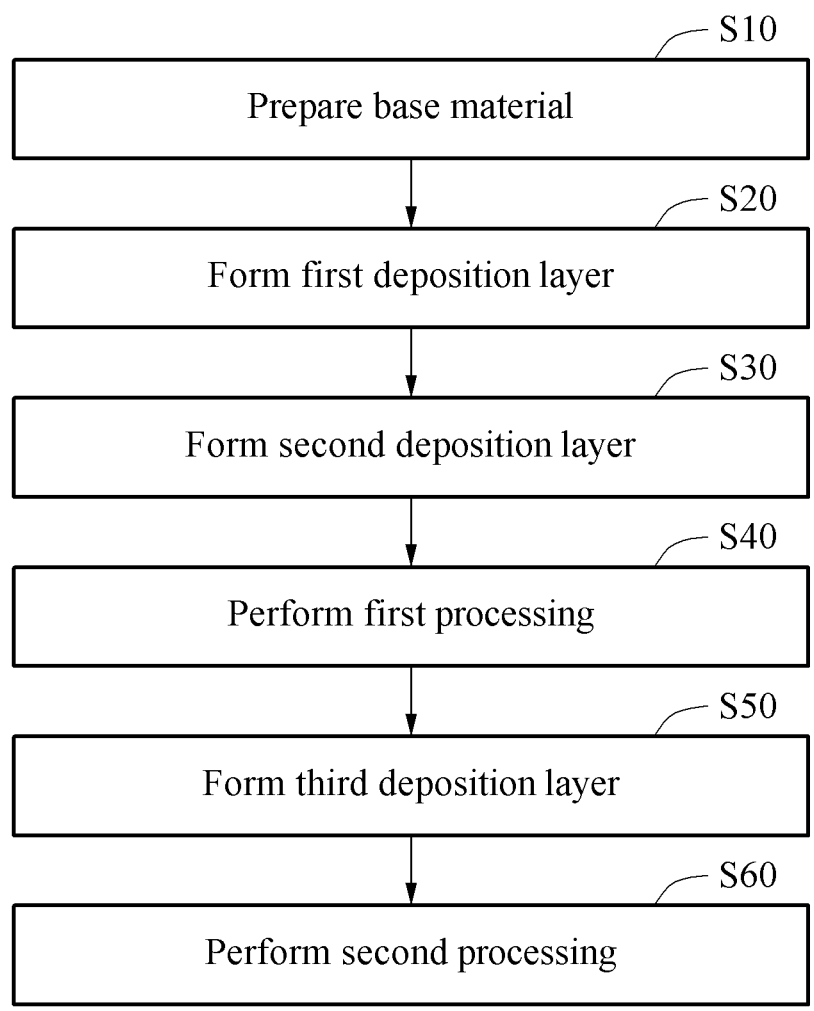
FIG. 4 illustrates a flowchart of a method of manufacturing a semiconductor manufacturing component including a deposition layer covering an interlayer boundary according to an example embodiment.

FIG. 4 illustrates a flowchart of a method of manufacturing a semiconductor manufacturing component including a deposition layer covering an interlayer boundary according to an example embodiment.

Figure 5:
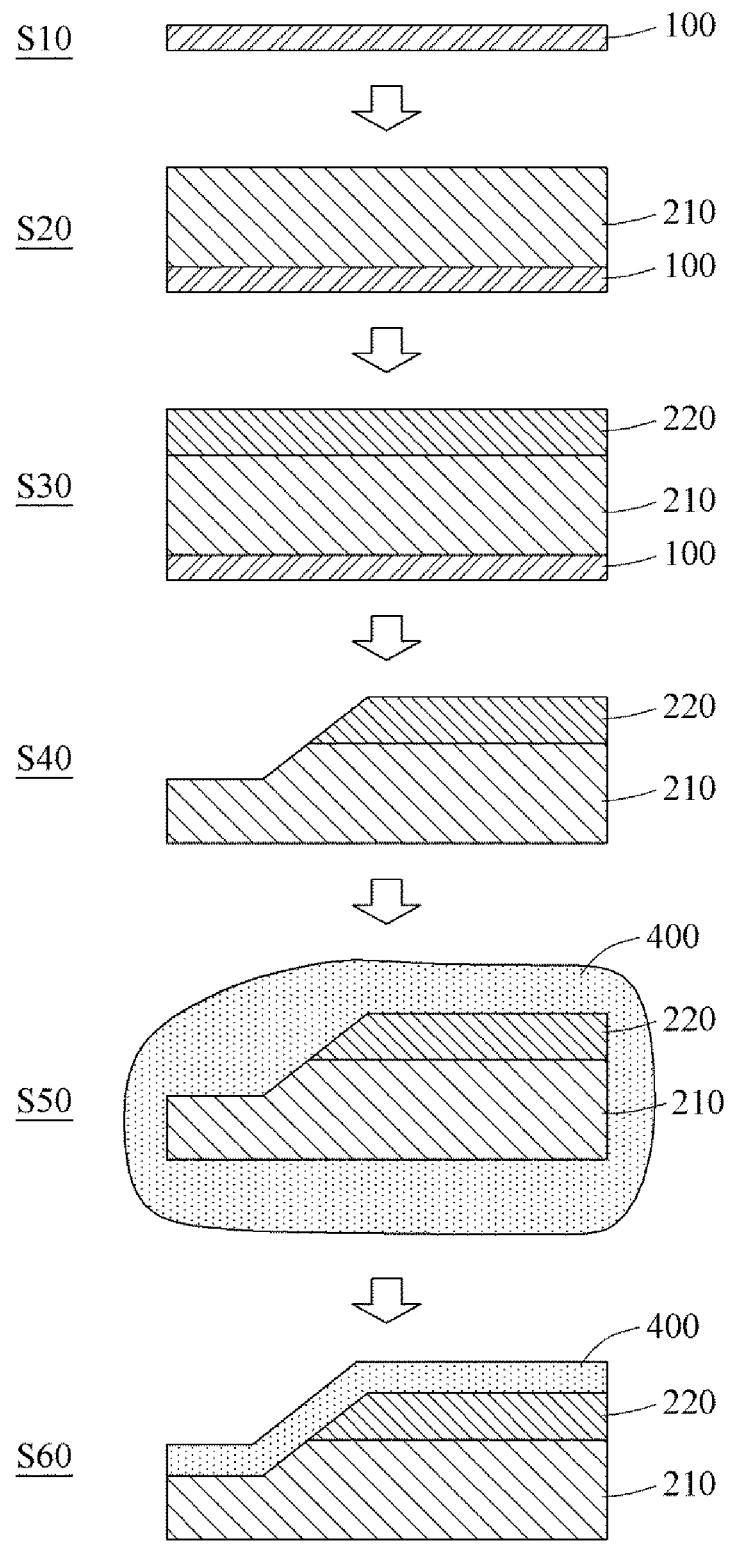
FIG. 5 illustrates each step of a method of manufacturing a semiconductor manufacturing component including a deposition layer covering an interlayer boundary, along with a cross section of the semiconductor manufacturing component manufactured according to an example embodiment.

FIG. 5 illustrates each step of a method of manufacturing a semiconductor manufacturing component including a deposition layer covering an interlayer boundary, along with a cross section of the semiconductor manufacturing component manufactured according to an example embodiment.

Figure 6:
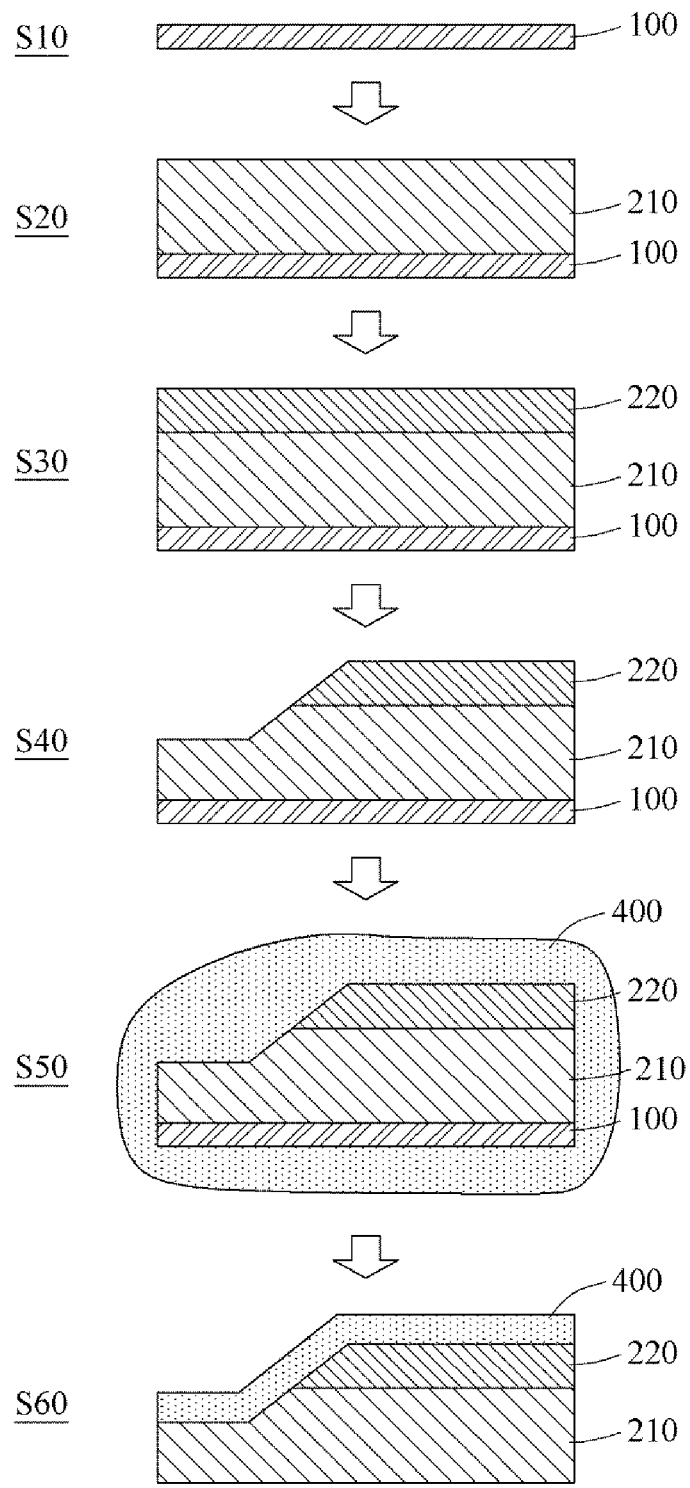
FIG. 6 illustrates each step of a method of manufacturing a semiconductor manufacturing component including a deposition layer covering an interlayer boundary, along with a cross section of the semiconductor manufacturing component manufactured according to another example embodiment.

FIG. 6 illustrates each step of a method of manufacturing a semiconductor manufacturing component including a deposition layer covering an interlayer boundary, along with a cross section of the semiconductor manufacturing component manufactured according to another example embodiment.

Hereinafter, a method of manufacturing a semiconductor manufacturing component including a deposition layer covering an interlayer boundary will be described with reference to FIGS. 4 through 6.

The method of manufacturing the semiconductor manufacturing component includes a deposition layer covering an interlayer boundary includes step S10 of preparing a base material, step S20 of forming a first deposition layer on the base material through chemical vapor deposition, step S30 of forming a second deposition layer on the first deposition layer through the chemical vapor deposition, step S40 of performing first processing, step S50 of forming a third deposition layer, and step S60 of performing second processing.

The base material may be a material including carbon, such as, for example, graphite, carbon black, natural graphite, artificial graphite, and synthetic graphite. The base material may function as a material used for deposition gas to be formed nearby in a deposition device and deposited on a surface thereof. Thus, as a result, the first through third deposition layers are formed on the base material. Herein, the first through third deposition layers may be formed on an entire surface of the base material, or only on one surface of the base material that is not masked, with another surface thereof being masked through masking.

The base material may be sufficiently used such that the first deposition layer is formed thereon. As illustrated, a size of a lower face of a first deposition layer 210 is equal to a size of an upper face of a base material 100, and thus the first deposition layer 210 is formed on the upper surface of the base material 100. In addition, the first deposition layer may also be formed to cover one side of the base material in addition to the upper face of the base material.

The first deposition layer is formed on the base material, and it is thus desirable to select a material of the base material for the first deposition layer to be readily deposed thereon based on a material of the first deposition layer.

The forming of the first deposition layer may include forming the first deposition layer on the upper surface of the base material through the chemical vapor deposition method. In this step, the first deposition layer may be formed to cover the upper surface of the base material and a portion of a side surface of the base material, and also a lower surface of the base material.

The forming of the second deposition layer may include forming the second deposition layer on the base material and the first deposition layer through the chemical vapor deposition. In this step, similarly to the first deposition layer, the second deposition layer may be formed to cover an upper surface of the base material and the first deposition layer, and additionally a side surface or a lower surface of the base material and the first deposition layer.

Subsequently, in the step of the first processing, the processing may be performed to satisfy a standard and shape required for the semiconductor manufacturing component. The processing may be performed using any means that physically processes an outer shape of the semiconductor manufacturing component.

Subsequently, the third deposition layer may be formed using the processed semiconductor manufacturing component on which the third deposition layer is to be deposited.

In general, processes of stacking a plurality of layers may be terminated after the layers are stacked and then processed. However, according to an example embodiment, at least two layers may be stacked, the first processing may be performed, and then the third deposition layer may be stacked. As described above, the third deposition layer may be formed to cover the first deposition layer and the second deposition layer and may thus become a portion that is most exposed to plasma in a plasma etching device. Thus, the third deposition layer may be formed with a highly plasma-resistant material, and formed to cover at least a portion of a boundary between the first deposition layer and the second deposition layer to minimize damage that may be done to a component in the plasma etching device.

Subsequently, in the step of the second processing, the processing may be performed again to satisfy a standard and shape required for the semiconductor manufacturing component. Similar to the first processing, the processing may be performed using any means that physically processes an outer shape of the semiconductor manufacturing component.

In the step of forming the first deposition layer and the step of forming the second deposition layer, a flow rate and a composition of deposition gas may be the same.

That is, the first deposition layer and the second deposition layer may be formed at a same deposition speed and have the same composition. The first deposition layer and the second deposition layer formed as described above may have a same growth pattern of a crystal face, which may be verified through an XRD experiment.

In the step of forming the third deposition layer, a supply flow rate of deposition gas may be 30% to 80% of a supply flow rate of the deposition gas used in the step of forming the first deposition layer and the step of forming the second deposition layer.

That is, the third deposition layer may be formed with a relatively less gas supply flow rate compared to the first deposition layer and the second deposition layer. It is verified that the deposition layer is relatively gradually and slowly formed. Thus, small and dense crystal grains may be formed. The third deposition layer formed as described above may have a relatively higher plasma resistance compared to the first deposition layer and the second deposition layer.

In the step of forming the first deposition layer and the step of forming the second deposition layer, a deposition layer forming speed may be 30 micrometers per hour (μm/hr) to 65 μm/hr.

The first deposition layer and the second deposition layer may be formed at a relatively high speed in a relatively short period of time. Herein, when the deposition layer forming speed is less than 30 μm/hr, the speed is extremely slow, and thus effect of improving a process productivity may be reduced. In contrast, when the deposition layer forming speed is greater than 65 μm/hr, a uniform or even deposition layer may not be formed due to such an extremely high speed.

In the step of forming the third deposition layer, a deposition layer forming speed may be 30% to 80% of the deposition layer forming speed used in the step of forming the first deposition layer and the step of forming the second deposition layer.

That is, the third deposition layer may be relatively slowly formed compared to the first deposition layer and the second deposition layer. Herein, when such a speed of forming the third deposition layer is less than 30% of the speed of forming the first deposition layer and forming the second deposition layer, a desirable productivity may not be achieved due to such an extremely slow speed. In contrast, when the speed of forming the third deposition layer is greater than 80% of the speed of forming the first deposition layer and the second deposition layer, a plasma-resistant characteristic of the third deposition layer may not be different from those of the first deposition layer and the second deposition layer. Thus, the third deposition layer may not desirably protect the boundary between the first deposition layer and the second deposition layer.

In the step of forming the first deposition layer and the step of forming the second deposition layer, the chemical vapor deposition method may be performed in a chemical vapor deposition chamber. Herein, source gas that forms each layer may be supplied through a plurality of source gas injecting nozzles. Herein, positions of the nozzles in the chemical vapor deposition chamber and the number of the nozzles may not be limited so long as they may stack the layers uniformly or evenly.

The method of manufacturing the semiconductor manufacturing component may further include a step of cleaning between the step of performing the first processing and the step of forming the third deposition layer, after the step of performing the second processing, or both between the step of performing the first processing and the step of forming the third deposition layer and after the step of performing the second processing. The step of cleaning may be included because impurities remain on a surface of the component after each of the processing steps. Herein, the cleaning may be performed using various means, such as, for example, acid, base, water, inert gas, and the like. However, the means are not limited to the examples described in the foregoing, and others that may remove impure residues formed on the surface of the component may also be used.

The first processing may be performed to process a face including at least a portion of the boundary between the first deposition layer and the second deposition layer. The first processing may be performed on a face such that the third deposition layer is smoothly deposited thereon. For example, when the first deposition layer, the second deposition layer, or both the first deposition layer and the second deposition layer is formed of a plurality of layers, the first processing may be performed to process a face including at least a portion of a boundary between the plurality of layers.

The first processing may include removing the base material.

The base material may be removed from a final product manufactured with the semiconductor manufacturing component. In the step of the first processing, the removing of the base material may be performed on a lower portion along with the processing of the first deposition layer and the second deposition layer. Herein, any methods that may not affect a quality of the first deposition layer and the second deposition layer may be used to remove the base material.

FIG. 5 is a cross-sectional view S40 of a structure in which the base material is removed in the step of the first processing and the base material is absent before the step of forming the third deposition layer according to an example embodiment.

The second processing may include removing the base material. In the step of the second processing, the base material may be processed or removed to satisfy a standard and shape required for the semiconductor manufacturing component. Herein, any methods that may not affect a quality of the first deposition layer and the second deposition layer may be used to remove the base material.

FIG. 6 is a cross-sectional view S60 of the semiconductor manufacturing component manufactured by removing the base material along with a deposited material of the third deposition layer in the step of the second processing according to another example embodiment.

The base material may include at least one selected from a group consisting of graphite, carbon black, SiC, TaC, and zirconium carbide (ZrC).

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

The invention claimed is:

1. A component of a plasma processing apparatus for manufacturing a semiconductor comprising a deposition layer covering an interlayer boundary, the component comprising:
   a focus ring comprising:
      a first deposition layer;
      a second deposition layer formed on the first deposition layer; and
      a third deposition layer formed on the second deposition layer to cover at least a portion of a boundary between the first deposition layer and the second deposition layer,
   wherein the first deposition layer, the second deposition layer, and the third deposition layer of the focus ring have a same composition.

2. The component of claim 1, wherein the first deposition layer, the second deposition layer, or both the first deposition layer and the second deposition layer is formed of a plurality of layers, and
   the third deposition layer is formed to cover at least a portion of a boundary between the plurality of layers of the first deposition layer, the second deposition layer, or both the first deposition layer and the second deposition layer.

3. The component of claim 1, wherein a grain size of each of the first deposition layer and the second deposition layer is greater than a grain size of the third deposition layer.

4. The component of claim 1, wherein a ratio of a sum of respective diffraction peak intensities of a face 200 and a face 220 to a diffraction peak intensity of a face 111 of an X-ray diffraction spectrum of each of the first deposition layer and the second deposition layer is 0.9 to 3.5.

5. The component of claim 1, wherein a ratio of a sum of respective diffraction peak intensities of a face 200 and a face 220 to a diffraction peak intensity of a face 111 of an X-ray diffraction spectrum of the third deposition layer is 0.05 to 0.9.

6. The component of claim 1, wherein a ratio of a diffraction peak intensity of a face 311 to a diffraction peak intensity of a face 111 of an X-ray diffraction spectrum of the third deposition layer is 0.05 to 0.3.

7. The component of claim 1, wherein each of the first deposition layer, the second deposition layer, and the third deposition layer includes at least one of silicon carbide (SiC) or tantalum carbide (TaC).

8. The component of claim 1, wherein a thickness of the third deposition layer is 0.7 millimeters (mm) to 2.5 mm.

9. The component of claim 1, wherein the first deposition layer and the second deposition layer have different transmittance values.

10. The component of claim 2, wherein the plurality of layers of the first deposition layer, the second deposition layer, or both the first deposition layer and the second deposition layer have different transmittance values.

11. The component of claim 1, wherein the third deposition layer is plasma-resistant.

\* \* \* \* \*